(12) United States Patent
Iizawa et al.

(10) Patent No.: US 6,784,595 B2
(45) Date of Patent: Aug. 31, 2004

(54) METHOD FOR ADJUSTING THE TEMPERATURE-DEPENDENT PROPERTY OF A SURFACE ACOUSTIC WAVE DEVICE AND A SURFACE ACOUSTIC DEVICE

(75) Inventors: Keigo Iizawa, Suwa (JP); Takashi Yamazaki, Suwa (JP); Shigeo Kanna, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 178 days.

(21) Appl. No.: 10/229,210

(22) Filed: Aug. 28, 2002

(65) Prior Publication Data

US 2003/0052572 A1 Mar. 20, 2003

(30) Foreign Application Priority Data

Aug. 29, 2001 (JP) ........................................ 2001-260122
Jun. 5, 2002 (JP) ........................................ 2002-164912

(51) Int. Cl.$^7$ .............................................. H01L 41/08
(52) U.S. Cl. .................... 310/311; 310/313 A; 310/360
(58) Field of Search ............................ 310/311, 313 R, 310/313 A, 346, 360

(56) References Cited

U.S. PATENT DOCUMENTS

| | | | |
|---|---|---|---|
| 4,166,228 A | * | 8/1979 | Solie ........................ 310/313 D |
| 4,319,154 A | * | 3/1982 | Solie ........................ 310/313 D |
| 4,609,843 A | * | 9/1986 | Carr et al. ................ 310/313 A |
| 5,895,996 A | | 4/1999 | Takagi et al. |

FOREIGN PATENT DOCUMENTS

| | | |
|---|---|---|
| EP | 0 738 039 A1 | 10/1996 |
| JP | 57-073513 A | 5/1982 |
| JP | 3216137 | 8/2001 |

OTHER PUBLICATIONS

Caron et al., "Surface Acoustic Wave Substrates for High Temperature Applications", *1996 IEEE International Frequency Control Symposium*, pp. 222–227.
Taziev et al., "Deformation–Sensitive Cuts for Surface Acoustic Waves in α–Quartz", *1993 IEEE International Frequency Control Symposium*, pp. 660–664.

* cited by examiner

Primary Examiner—Mark Budd
(74) Attorney, Agent, or Firm—Oliff & Berridge, PLC

(57) ABSTRACT

The invention provides a method for adjusting the temperature-dependent property of a surface acoustic wave device is provided,, The method is appropriate for a temperature-dependent property that is expressed by a cubic function of a surface acoustic wave device using an in-plane rotated ST cut quartz crystal plate. The invention therefore provides a method for adjusting the temperature-dependent property of a surface acoustic wave device using an in-plane rotated ST cut quartz crystal plate having Euler angles of (0°, 113–135°, ±(40–49°)). The range of Euler angles is defined so that the temperature-dependent property of the surface acoustic wave device, using an in-plane rotated ST cut quartz crystal plate having the temperature-dependent property expressed by a cubic function, has an extreme value within the temperature range of −40 to +85° C., and the temperature-dependent property is rotated about the inflection point to minimize the frequency fluctuation within the operational temperature range by using appropriate regions.

8 Claims, 19 Drawing Sheets

1 : quartz crystal plate
2 : quartz crystal Z plate
3 : surface acoustic wave apparatus
ψ : axis of rotation in the plane 1 : quartz crystal plate
2 : quartz crystal Z plate
3 : surface acoustic wave apparatus
$\psi$ : axis of rotation in the plane

Fig. 13

(1)
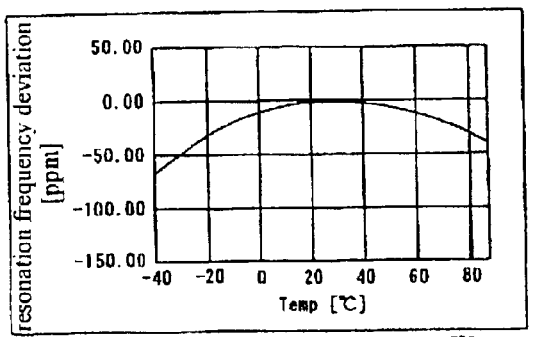
$\psi=43.0°$, $H/\lambda=0.0368$, $\eta=0.5$, $\theta max=25°C$
frequency fluctuation: 71ppm (2) [means 1, change the deposit thickness]
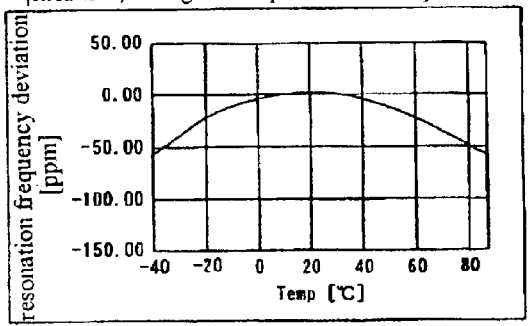
$\psi=43.0°$, $H/\lambda=0.0405$, $\eta=0.5$, $\theta max=17.70°C$
frequency fluctuation: 58ppm (3) [means 2, change $\psi$]
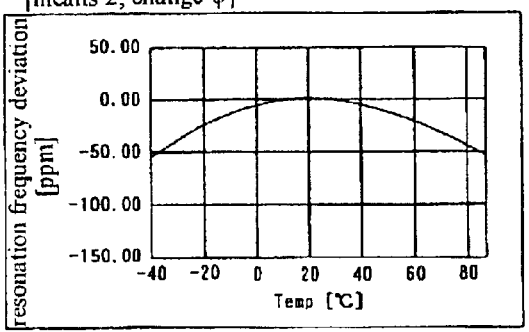
$\psi=43.1°$, $H/\lambda=0.0368$, $\eta=0.5$, $\theta max=17.24°C$
frequency fluctuation: 57ppm (4) [means 3, change $\eta$],]
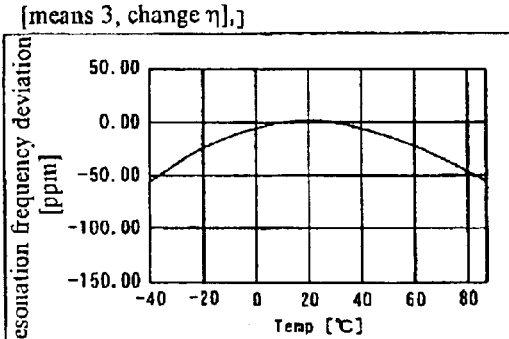
$\psi=43.0°$, $H/\lambda=0.0368$, $\eta=0.525$, $\theta max=17.23°C$
frequency fluctuation: 58ppm Euler's angles (0°, 123°, 0°), H/λ=0.028, η=0.5, θmax=25°C
frequency fluctuation: 144ppm

METHOD FOR ADJUSTING THE TEMPERATURE-DEPENDENT PROPERTY OF A SURFACE ACOUSTIC WAVE DEVICE AND A SURFACE ACOUSTIC DEVICE

BACKGROUND OF THE INVENTION

1. Field of Invention

The present invention relates to a method for adjusting the temperature-dependent property of a surface acoustic wave device using an in-plane rotated ST cut quartz crystal plate. The invention also relates to a surface acoustic wave device utilizing such a method.

2. Description of Related Art

Related art quartz crystal piezoelectric resonators are subject to a temperature-dependent property (i.e., a frequency fluctuation property in association with temperature changes). This property may be expressed by a quadratic function, such as that of tuning fork type resonators and a surface acoustic wave device, or by a cubic function, such as that of AT resonators.

The temperature-dependent property of a piezoelectric resonator is adjusted so that the frequency fluctuation is minimized in the operational temperature range (−40 to +85° C.) including a normal operational temperature of 25° C. In a piezoelectric resonator having the temperature-dependent property expressed by a quadratic function, the peak temperature of the temperature-dependent property of the piezoelectric resonator (i.e., the temperature that gives an extreme value of frequency) is centered in the operational temperature range so that the frequency fluctuation is minimized. Related art piezoelectric resonators having the temperature-dependent property expressed by a quadratic function have the peak temperature in a range of 0° C. to 50° C.

The temperature-dependent property of the AT cut resonator, expressed by a cubic function, has a limited frequency fluctuation in the operational temperature range because the temperature at the inflection point is located almost at the center of the operational temperature range.

The surface acoustic wave resonator, typically a SAW resonator or a SAW filter, can utilize an in-plane rotated ST cut quartz crystal plate for the purpose of reducing frequency fluctuation in association with temperature changes.

In the related art, the surface acoustic wave device using an in-plane rotated ST cut quartz crystal plate also is believed to have the temperature-dependent property expressed by a quadratic function, as is the surface acoustic wave device using a related art ST cut quartz crystal plate. Therefore, the peak temperature of the surface acoustic wave device using an in-plane rotated ST cut quartz crystal plate coincides with the center of the operational temperature range so as to minimize the frequency fluctuation associating with temperature changes.

SUMMARY OF THE INVENTION

As is described above, in the related art, the surface acoustic wave device using the in-plane rotated ST cut quartz crystal plate is believed to have the temperature-dependent property expressed by a quadratic function.

However, recent studies by the present inventors have proven that the temperature-dependent property is actually expressed by a cubic function having an inflection point nearly at 110° C. In general, measurements of the temperature-dependent property are not obtained for temperatures that greatly exceed 110° C. This explains why it has not been found that the surface acoustic wave device using an in-plane rotated ST cut quartz crystal plate has the temperature-dependent property expressed by a cubic function. In the related art, an adjustment of the temperature-dependent property of a surface acoustic wave device using an in-plane rotated ST cut quartz crystal plate involves a quadratic function. Therefore, it actually fails to optimize frequency fluctuation in the operational temperature range.

A problem arises that related art adjustment techniques do not substantially optimize the temperature-dependent property of a surface acoustic wave device using an in-plane rotated ST cut quartz crystal plate, since it has the temperature-dependent property expressed by a cubic function, and not by a quadratic function.

In view of the problem described above with regard to the related art, the present invention provides a method for adjusting the temperature-dependent property of a surface acoustic wave device. This method is suitable to the temperature-dependent property expressed by a cubic function of a surface acoustic wave device using an in-plane rotated ST cut quartz crystal plate, and a surface acoustic wave device.

The present invention is based on the finding that the surface acoustic wave device using an in-plane rotated ST cut quartz crystal plate actually has the temperature-dependent property expressed by a cubic function and, therefore, the peak temperature can be shifted from the center of the operational temperature range to further reduce the frequency fluctuation. This is in contrast to the related art where it has been considered to have the temperature-dependent property expressed by a quadratic function, and where the peak temperature is therefore arranged to be located at the center of the operational temperature range.

A method for adjusting the temperature-dependent property of a surface acoustic wave device according to the present invention includes an in-plane rotated ST cut quartz crystal plate having the Euler angles of (0°, 113–135°, ±(40–49°)). The temperature-dependent property of the surface acoustic wave device using the in-plane rotated ST cut quartz crystal plate having the temperature-dependent property expressed by a cubic function is adjusted by rotating it about the inflection point. The range of the Euler angles is determined so that the temperature-dependent property of the surface acoustic wave device using the in-plane rotated ST cut quartz crystal plate has an extreme value and, then, the temperature-dependent property is rotated about the inflection point to minimize fluctuation of the temperature-dependent property in the operational temperature range.

When the Euler angles are (0°, θ, ψ), ψ is in the following range:

$$\psi = 0.3295\ \theta + 3.3318° \pm 1.125°.$$

In particular, when the Euler angles are (0°, θ, ψ), it is preferred that θ=125–128°, and η (electrode width/electrode pitch) is 0.3–0.6.

The temperature-dependent property around the inflection point is adjusted by modifying the thickness of the electrode deposits of the surface acoustic wave device. Alternatively, it is adjusted by modifying the rotation of the quartz crystal in a plane about the Z' axis. Alternatively, it is also adjusted by modifying η (electrode width/electrode pitch) of the electrodes of the surface acoustic wave device. The surface acoustic wave device of the present invention is manufactured by the method for adjusting the temperature-dependent property of a surface acoustic wave device described above.

As is described above, it has been found by the present inventors that the surface acoustic wave device using an in-plane rotated ST cut quartz crystal plate having the Euler angles of (0°, 113–135°, ±(40–49°)) has the temperature-dependent property expressed by a cubic function. When a range of the Euler angles corresponds to the temperature-dependent property of an extreme value expressed by a cubic function, it is determined within the range (0°, 113–135°, ±(40–49°)). Then, the temperature-dependent property is rotated about the inflection point expressed by a cubic function within the above range to minimize fluctuation of the temperature-dependent property (i.e., frequency fluctuation) in the operational temperature range. In particular, with θ of the Euler angles being 125–128° and η (electrode width/electrode pitch) being 0.3–0.6, the frequency fluctuation can be minimized in the temperature range of −40 to +85° C., even taking into account the fluctuation of the temperature-dependent property due to a manufacturing error that has a larger influence on higher frequencies. The temperature-dependent property around the inflection point is modified by adjusting the rotation of the quartz crystal in a plane about the Z' axis or modifying the thickness or width of the electrode deposits formed on the surface.

The ranges of the Euler angles, in which the temperature-dependent property expressed by a cubic function has an extreme value, have been verified by the present inventors. Therefore, this range can be targeted in modifying the rotation of a plane.

BRIEF DESCRIPTION OF THE DRAWINGS

FIGS. 13(1)–13(4) are graphs explaining the adjustment processes of the temperature-dependent property expressed by a cubic function;

DETAILED DESCRIPTION OF PREFERRED EMBODIMENTS

Embodiments of the method for adjusting the temperature-dependent property of a surface acoustic wave device and the surface acoustic wave device of the present invention are hereinafter described with reference to the drawings.

The surface acoustic wave device using an in-plane rotated ST cut quartz crystal plate has the temperature-dependent property expressed by a cubic function, while a related art surface acoustic wave device using a quartz crystal has the temperature-dependent property expressed by a quadratic function. The surface acoustic wave device having the temperature-dependent property expressed by a cubic function has an inflection point at a higher temperature than the upper limit of the normal operational temperature range. Having the proximity of the local maximum of the temperature-dependent property expressed by the cubic function in the operational temperature range can provide a surface acoustic wave device with a reduced frequency fluctuation associated with temperature changes.

Figure 1:
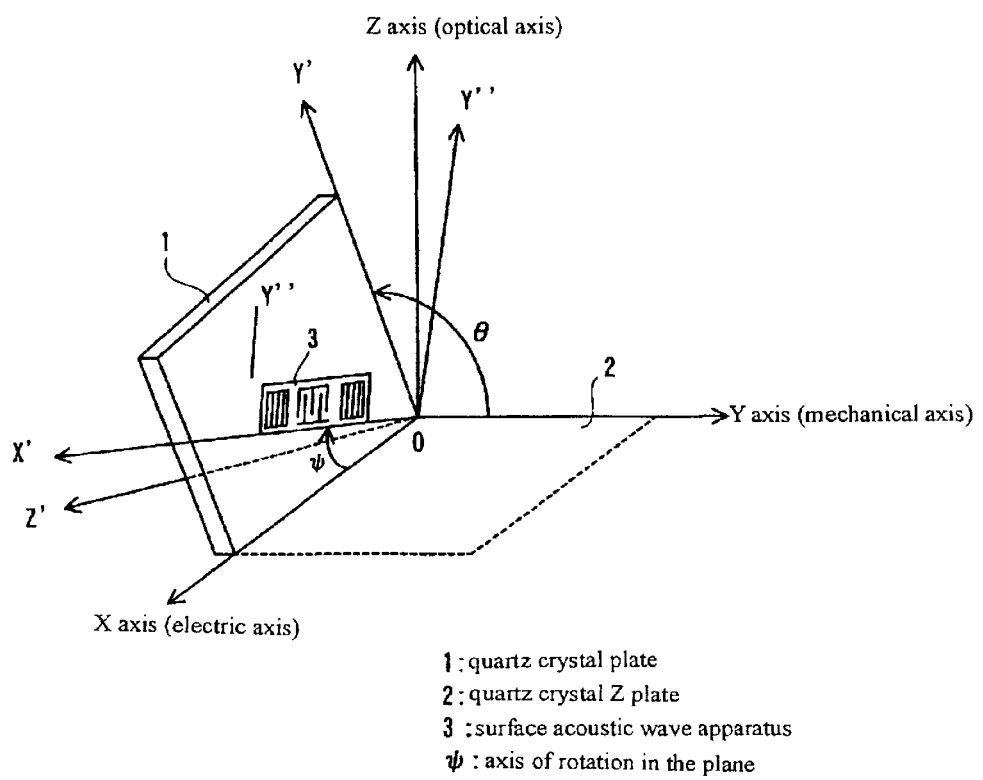
FIG. 1 is a schematic showing an in-plane rotated ST cut quartz crystal about the Z' axis.

The temperature-dependent property of a piezoelectric resonator is determined by the direction in which it is cut out of quartz crystal. Quartz crystal has electric (X), mechanical (Y), and optical (Z) axes as is shown in FIG. 1. A quartz crystal Z plate 2 having the Euler angles ($\phi$, $\theta$, $\psi$) of (0°, 0°, 0°) is rotated by $\theta$=113–135° about the electric axis (X axis) to obtain a quartz crystal plate 1. Then, the quartz crystal plate 1 has the new axes (X, Y', Z'), along which an ST cut is made. The ST cut quartz crystal 1 is further rotated by $\psi$=±(40–49°) about the Z' axis to obtain a piezoelectric resonator having a surface acoustic wave propagation direction defined by this rotation, which is referred to as an in-plane rotated ST cut surface acoustic wave device 3. The in-plane rotated ST cut surface acoustic wave device 3 has an excellent temperature-dependent property. This temperature-dependent property has been considered to be a quadratic function in the related art because the device is a type of ST cut. However, studies by the present inventors have proven that the temperature-dependent property is actually expressed by a cubic function having an inflection point around 110° C. In general, measurements of the temperature-dependent property are not obtained for temperatures that greatly exceed 110°. This explains why it has not been found that the surface acoustic wave device using an in-plane rotated ST cut quartz crystal plate has the temperature-dependent property expressed by a cubic function. In the related art, adjustment of the temperature-dependent property of a surface acoustic wave device using an in-plane rotated ST cut quartz crystal plate involves a quadratic function. Therefore, it actually fails to optimize frequency fluctuation in the operational temperature range.

As discussed above, the in-plane rotated ST cut surface acoustic wave device has the temperature-dependent property expressed by a cubic function. The term having the first-order coefficient in the cubic function is adjusted to rotate the temperature-dependent property about the inflection point that is outside the operational temperature range so that the peak temperature, which is the temperature with the local maximum or local minimum within the operation temperature range, is adjusted to the optimum value in the operational temperature range. In more detail, a quartz crystal plate is rotated by $\theta$=113–135° about the electric axis (X axis) to obtain a ST cut quartz crystal plate, which is further rotated by $\psi$=±(40–49°) in the plane about the Z' axis. Within this range, a range is selected for the temperature-dependent property having an extreme value within the operational temperature range of −40 to +85° C. The rotation in the plane is modified within this range giving an extreme value to coincide the local maximum or local minimum of the temperature-dependent property with the optimum temperature within the operational temperature.

Figure 2:
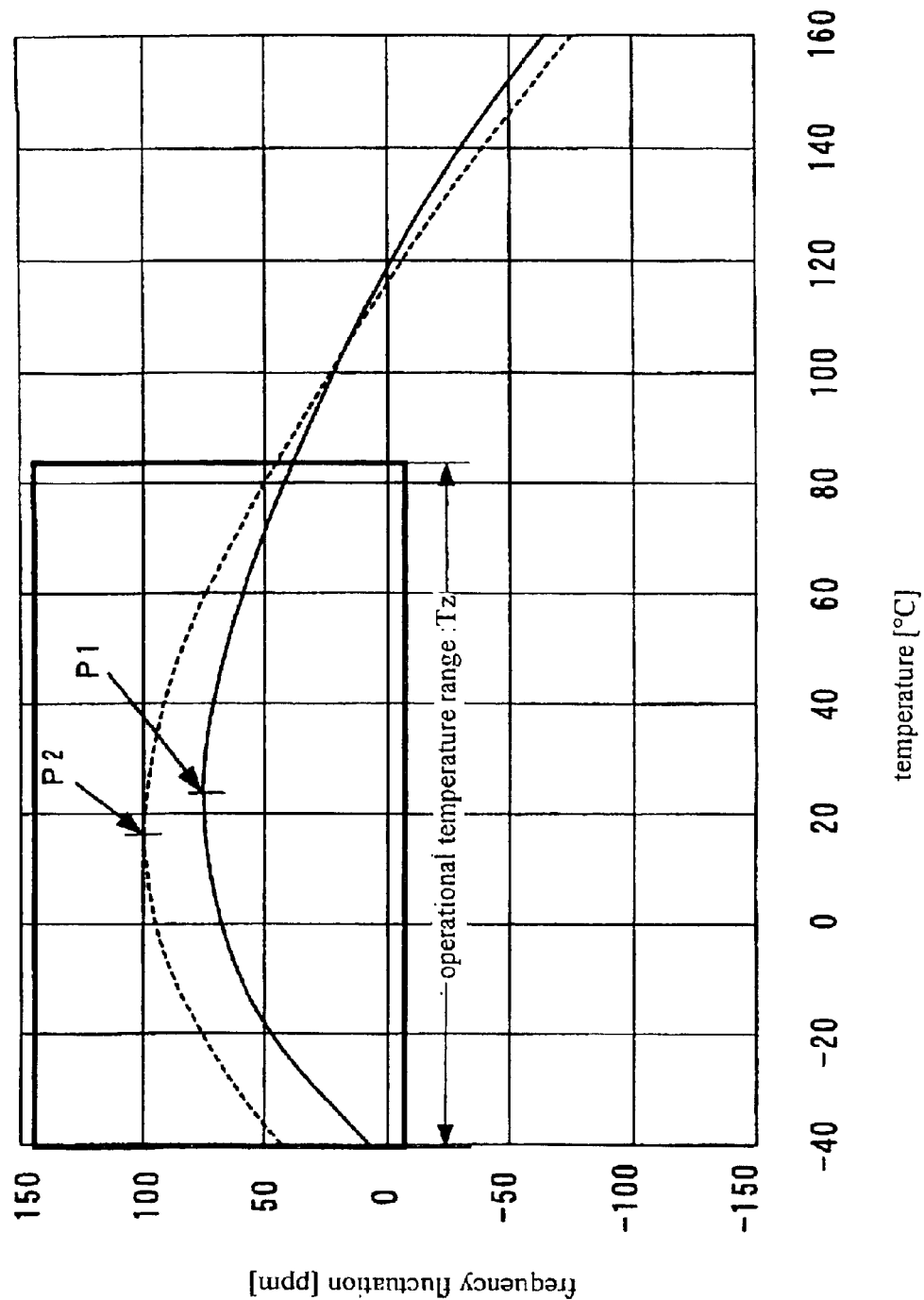
FIG. 2 is a graph showing the temperature-dependent property curve of a surface acoustic wave device using an in-plane rotated ST cut quartz crystal about the Z' axis.

As is shown in FIG. 2, the temperature-dependent property of an in-plane rotated ST cut surface acoustic wave device has an inflection point temperature at approximately 110° C. The operational temperature range is −40 to +85° C., which is lower than the inflection point temperature. On the temperature-dependent property curve of a cubic function, a temperature range including a local maximum at a lower temperature than the inflection point temperature is employed (included within rectangular portion in FIG. 2). The inflection point of the temperature-dependent property expressed by a cubic function is barely modified. Therefore, the term having the first-order coefficient is adjusted to rotate the temperature-dependent property curve about the inflection point. In this way, the local maximum of the temperature-dependent property curve within the operational temperature range is moved to lower temperatures than the center of the operational temperature range. The temperature-dependent property curve shown by the solid line in FIG. 2 has the local maximum P1 at the center of the operational temperature range Tz. This is obtained by the related art adjustment in which the temperature-dependent property is treated as a quadratic function. After the temperature-dependent property curve is rotated about the inflection point, the result of which is shown by the broken line, the local maximum temperature is moved to P2 from P1. This can minimize frequency fluctuation within the operational temperate range.

An in-plane rotated ST cut surface acoustic wave device is manufactured as follows. First, a ST cut quartz crystal wafer is prepared. An in-plane rotated angle ($\psi$ is provided from the orientated flat, along which reflection electrodes (referred to as "Reflector") and fingers-interleaved electrodes (referred to as "IDT (Interdigital transducer )") are provided on the resonation regions by lithographic techniques. In practice, the temperature-dependent property expressed by a cubic function is adjusted by modifying the rotation angle $\psi$=±(40–49°) in the plane to change the surface acoustic wave propagation direction. The relationship between changes in $\psi$ and in the term having the first-order coefficient of the temperature-dependent property expressed by a cubic function is known. Therefore, direction and magnitude is predictable for the adjustment. An in-plane rotated ST cut surface acoustic wave device is created and its temperature-dependent property is analyzed. The rotation magnitude is determined so that the local maximum (or local minimum) shifts to the lower temperatures than the center of the designed operational temperature range. Then, $\psi$ is calculated according to the rotational magnitude. Then, the orientated flat corresponding to the rotation angle $\psi$ in the plane is determined in the range of ±(40–49°) to create reflectors and IDT. In this way, an in-plane rotated ST cut surface acoustic wave device with minimized frequency fluctuation within the operational temperature range is obtained.

Figure 3:
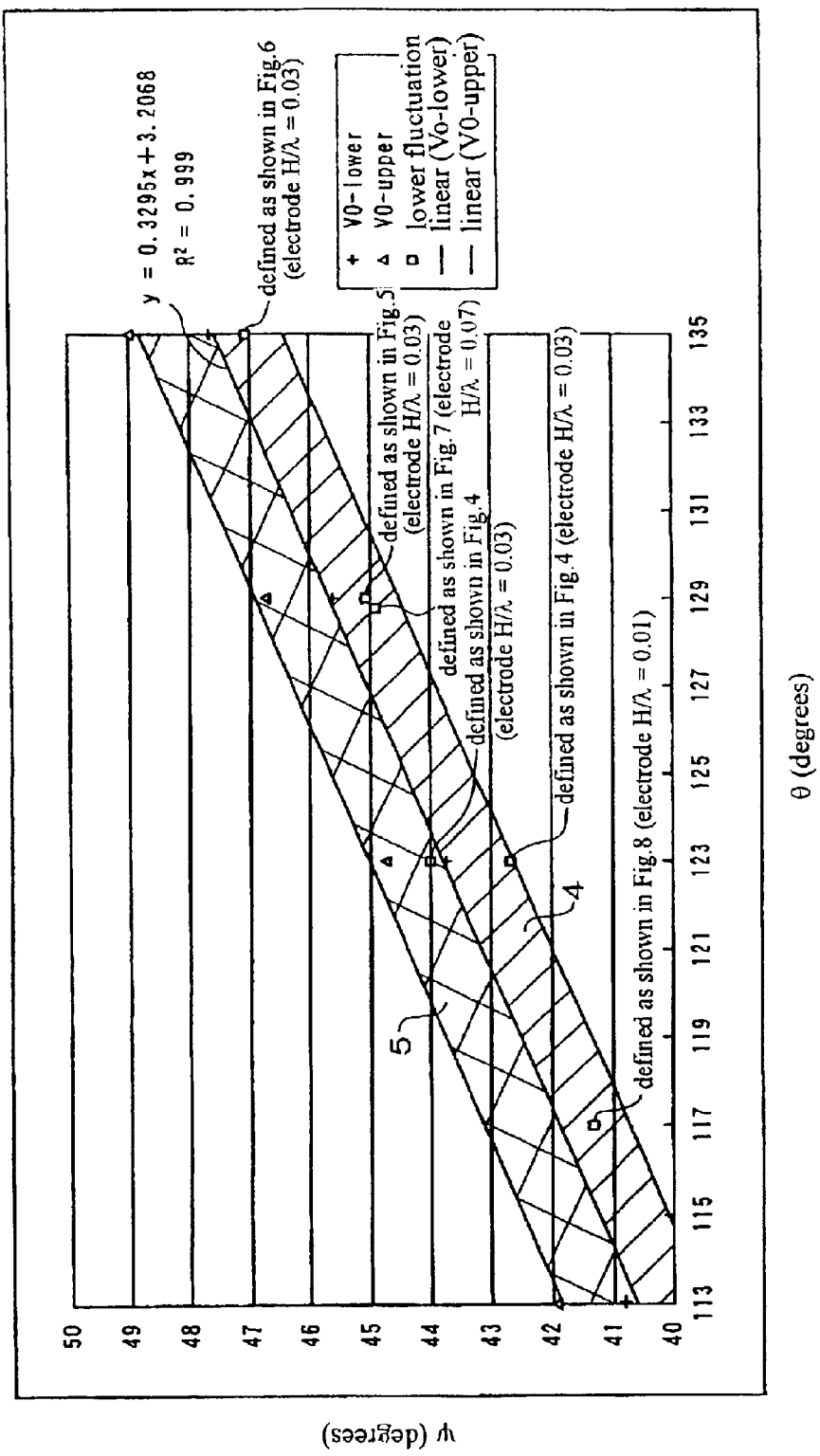
FIG. 3 is a graph showing show the range in which the temperature-dependent property curve having an extreme value is easily found for an in-plane rotated ST cut quartz crystal plate having the Euler angles of (0, 113–135°, ±(40–49°))

FIG. 3 is a graph showing the range in which the possible temperature-dependent property curve having an extreme value is easily found for an in-plane rotated ST cut quartz crystal plate having the Euler angles of (0°, 113–135°, ±(40–49°)).

Studies by the present inventors found the ranges of $\theta$ and $\psi$ that facilitate the finding, in the range having the temperature-dependent property expressed by a cubic function shown in FIG. 3, of the temperature-dependent property curve having an extreme value (local maximum or local minimum) within the temperature range of −40 to +85° C. for a transversal type surface acoustic wave device. These ranges are shown by the hatching 5 in FIG. 3. The hatching 4 shows additional ranges of θ and ψ that help to find the temperature-dependent property curve having an extreme value (local maximum or local minimum) within the temperature range above for a resonator-type surface acoustic wave device, but does not overlap the hatching 5. The values of ψ are smaller compared to those of the hatching 5 for the electrodes formed. The combined region of the hatchings 4 and 5 is defined by the following expression 1: (because written "expression 1" in [0059])

$$\psi=0.3295\theta+3.3318°±1.125°$$

Rotation in a plane about the Z' axis within the region indicated by the hatchings 4 and 5 leads to find the temperature-dependent property curve having an extreme value (local maximum or local minimum). Then, the temperature-dependent property curve is further rotated about the inflection point to minimize the frequency fluctuation within the operational temperature range.

The temperature-dependent property at the boarders of the hatchings 4 and 5 was studied, and the ranges indicated by the hatchings 4 and 5 have been verified by the present inventors. The surface acoustic wave device having an in-plane rotated ST cut quartz crystal of this embodiment include a transversal type SAW filter and a resonator type SAW device (such as a SAW resonator, a resonator type SAW filter).

FIGS. 9 to 12 are graphs verifying that the cubic function has/does not have an extreme value in a transversal type SAW filter using an in-plane rotated ST cut quartz crystal plate having the Euler angles of (0°, 113–135°, ±(40–49°)).

The ranges of θ and ψ are found from these figures that facilitate the finding of the temperature-dependent property having an extreme value (local maximum or local minimum) within the temperature range of −40 to +85° C. for a surface acoustic wave device of transversal type SAW filter. These ranges are shown by the hatching 5 in FIG. 3 and defined by the following expression 2:

$$\psi=0.3295\ \theta+3.8318°±0.625°$$

Studies by the present inventors on the temperature-dependent property of a resonator type SAW device besides the temperature-dependent properties of a transversal type SAW filter showed various regularities. A transversal type SAW filter is provided with a transmission IDT electrode (comb electrode) and a reception IDT electrode spaced from each other on the surface of a piezoelectric quartz crystal board. Nothing is present between the IDT electrodes in the SAW filter. The width and thickness of the electrodes hardly affect the temperature-dependent property of frequency (the temperature-dependent property is hardly changed by modifying the electrode form). On the contrary, a resonator type SAW device has an IDT electrode on the surface of a piezoelectric quartz crystal board, on which reflector electrodes are formed to sandwich the IDT electrode. Therefore, the width and thickness of the IDT electrode cause the temperature-dependent property to undergo changes.

Figure 4:
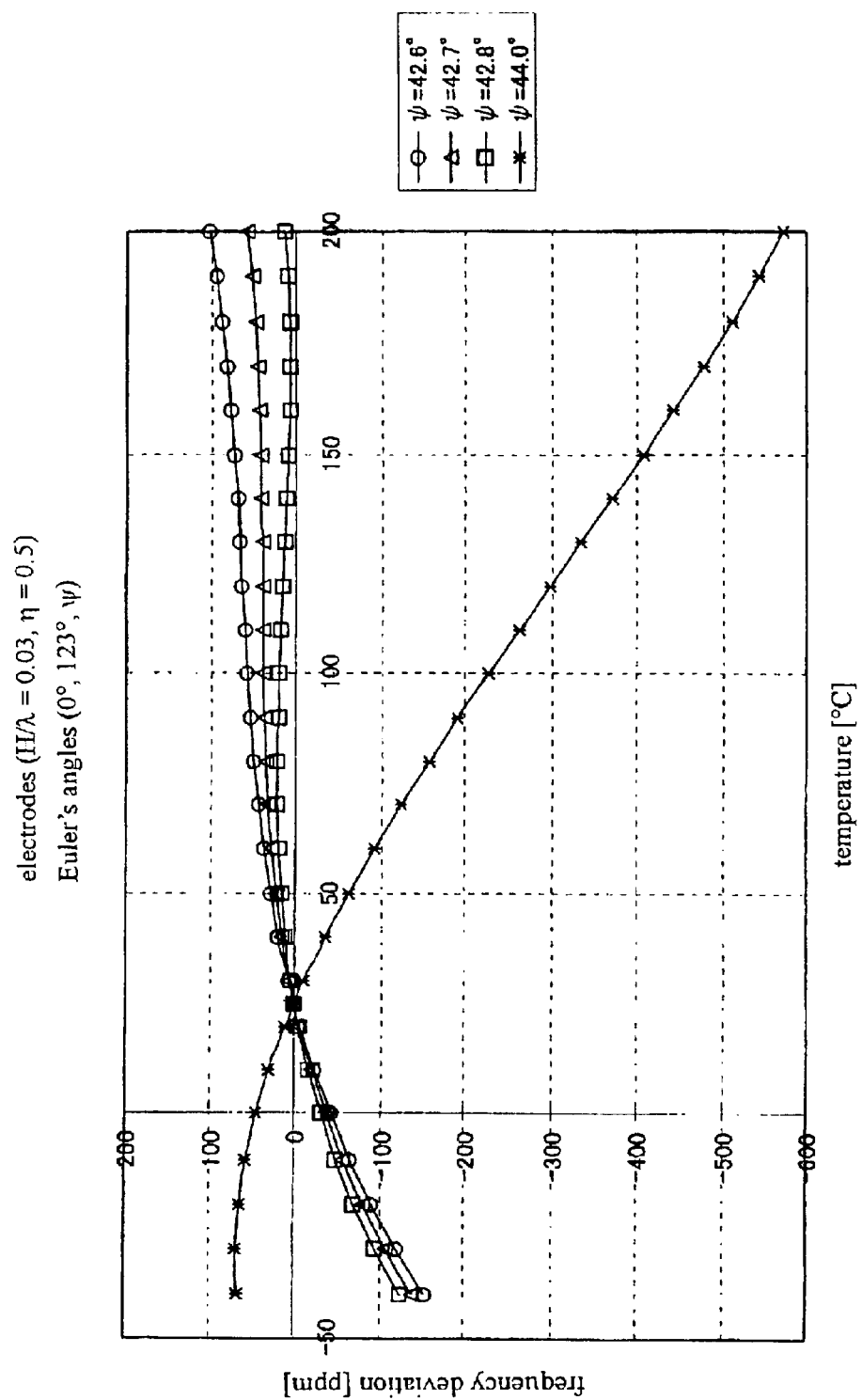
FIG. 4 is a graph verifying that the cubic function has/does not have an extreme value for a resonator type SAW device using an in-plane rotated ST cut quartz crystal plate having the Euler angles of (0°, 113–135°, ±(40–49°))
Figure 5:
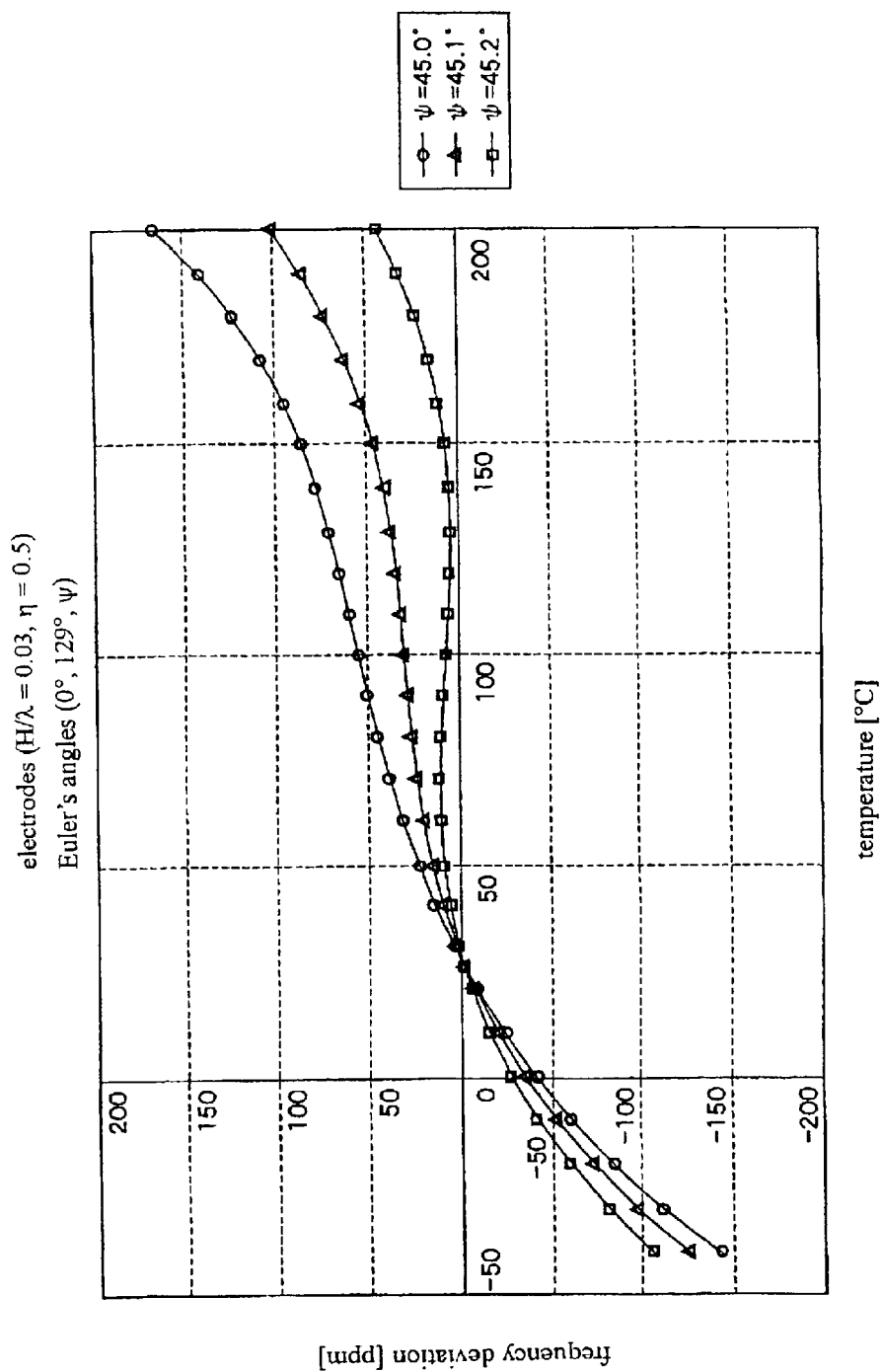
FIG. 5 is a graph verifying that the cubic function has/does not have an extreme value in a resonator type SAW device using an in-plane rotated ST cut quartz crystal plate having the Euler angles of (0°, 113–135°, ±(40–49°))
Figure 6:
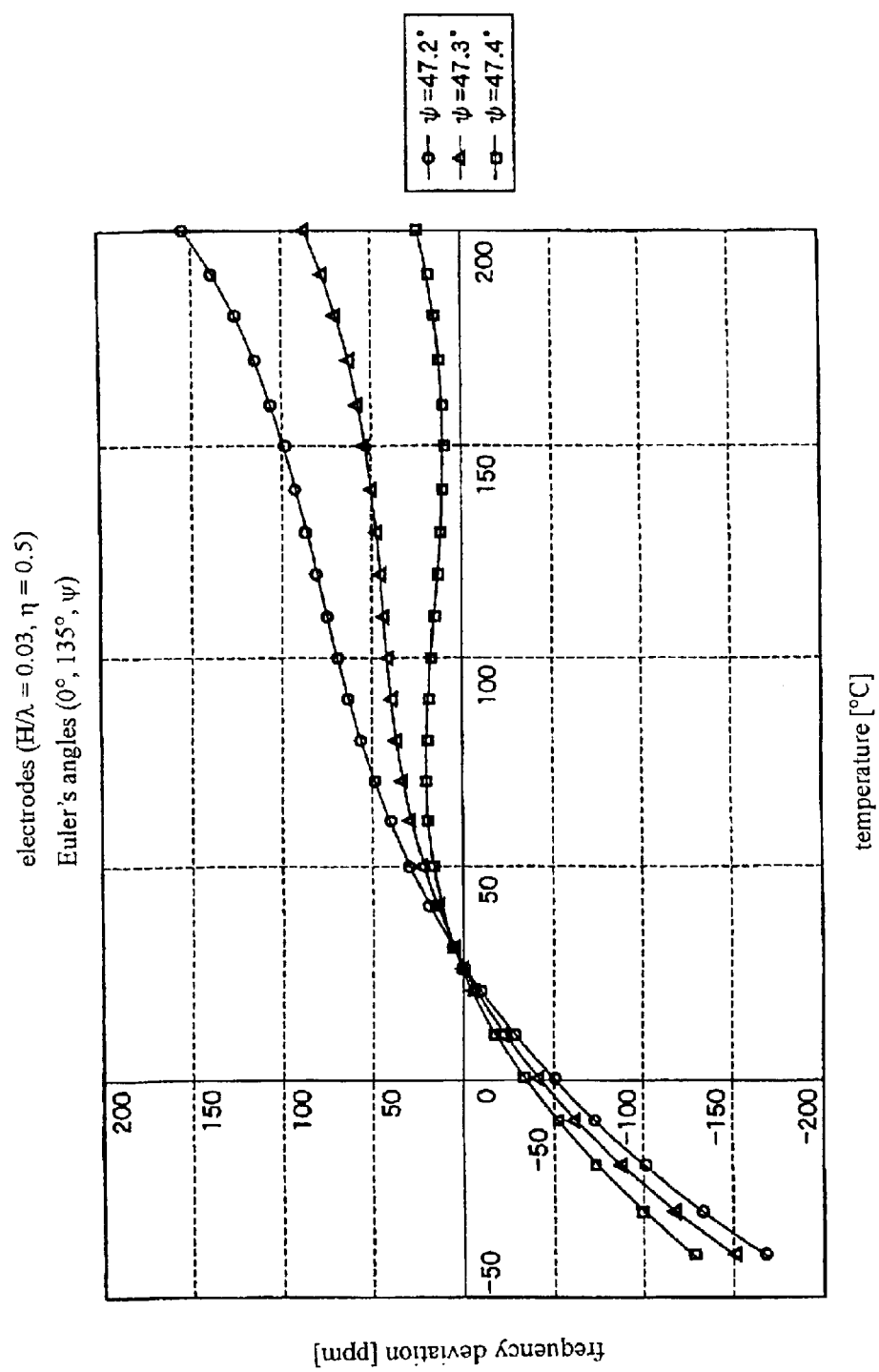
FIG. 6 is a graph verifying that the cubic function has/does not have an extreme value in a resonator type SAW device using an in-plane rotated ST cut quartz crystal plate having the Euler angles of (0°, 113–135°, ±(40–49°))
Figure 7:
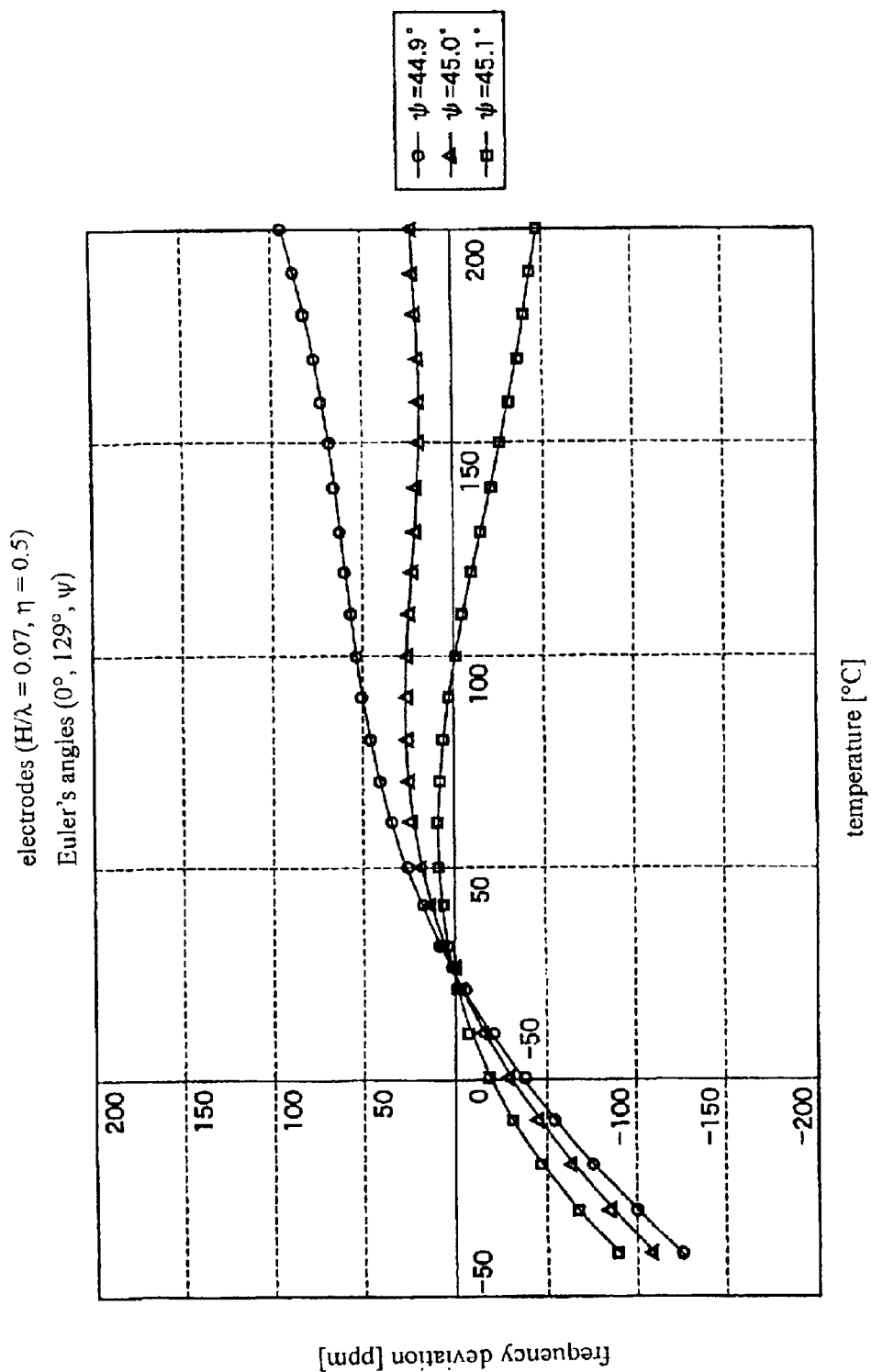
FIG. 7 is a graph verifying that the cubic function has/does not have an extreme value in a resonator type SAW device using an in-plane rotated ST cut quartz crystal plate having the Euler angles of (0°, 113–135°, ±(40–49°))
Figure 8:
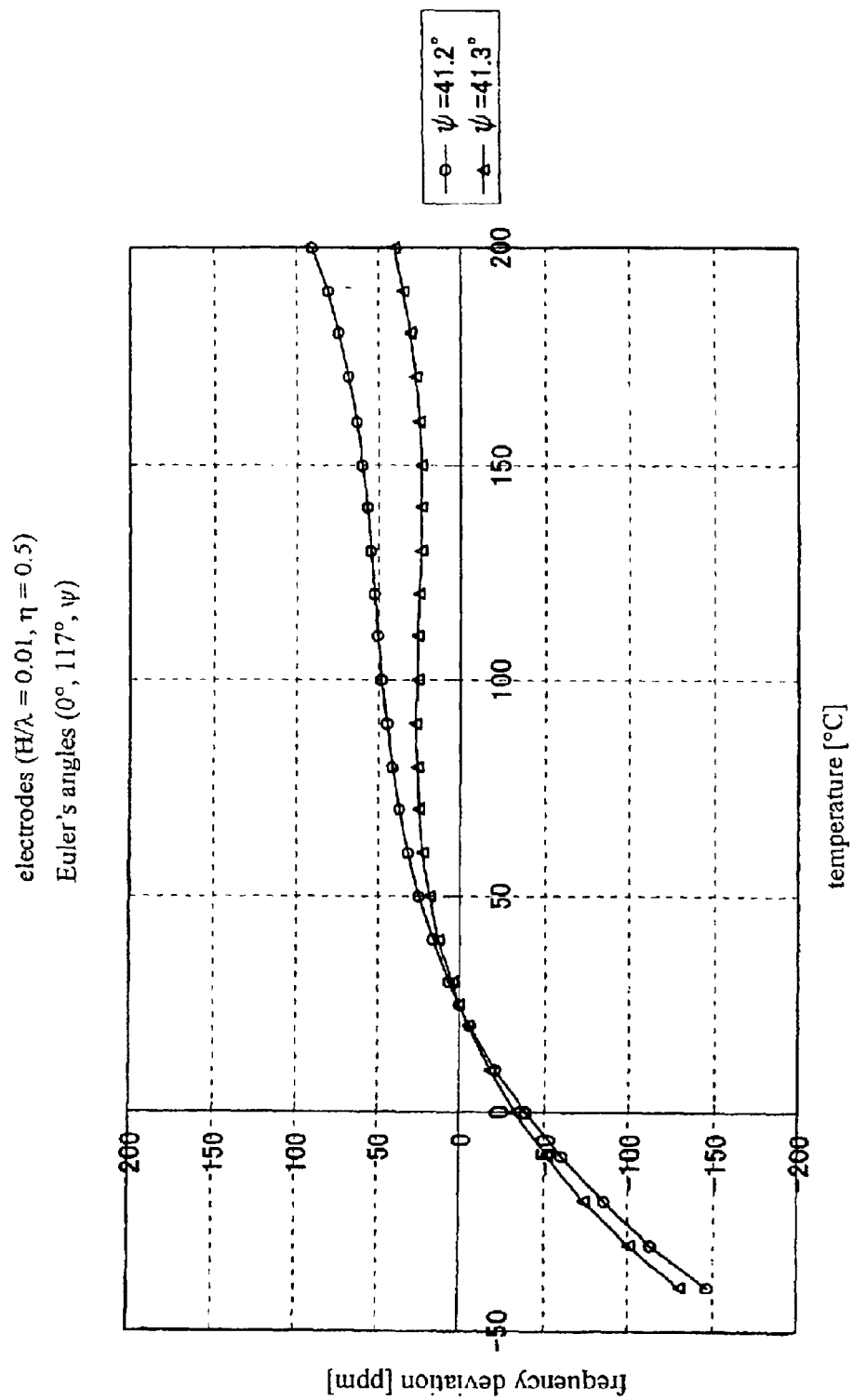
FIG. 8 is a graph verifying that the cubic function has/does not have an extreme value in a resonator type SAW device using an in-plane rotated ST cut quartz crystal plate having the Euler angles of (0°, 113–135°, ±(40–49°))
Figure 9:
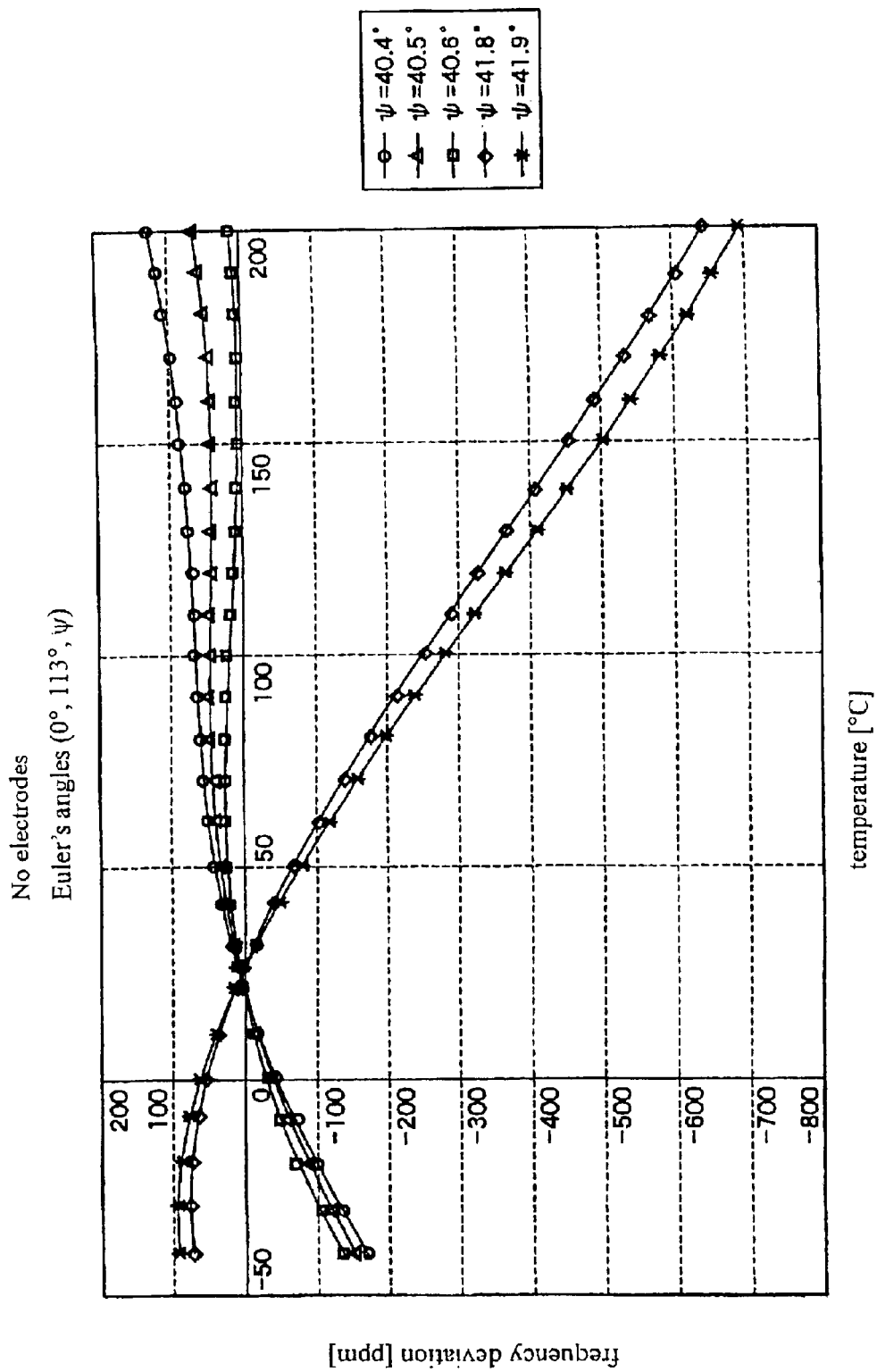
FIG. 9 is a graph verifying that the cubic function has/does not have an extreme value in a transversal type SAW filter using an in-plane rotated ST cut quartz crystal plate having the Euler angles of (0°, 113–135°, ±(40–49°))

FIG. 4 is a graph verifying that the cubic function has/does not have an extreme value within the temperature range of −40 to +85° C. for a resonator type SAW device using an in-plane rotated ST cut quartz crystal plate having the Euler angles of (0°, 123°, ±(40–49°)). As is shown in FIG. 4, it is understood that the temperature-dependent property has no extreme values within the temperature range of −40 to +85° C. when the in-plane rotation angle ψ in the plane is smaller than the range shown by the hatching 4 in FIG. 3. It is also understood that FIG. 4 shows the temperature-dependent property has an extreme value when the in-plane rotation ψ in the plane is larger than shown by the hatching 4 in FIG. 3 and also shows this is included in the hatching 5.

Figure 10:
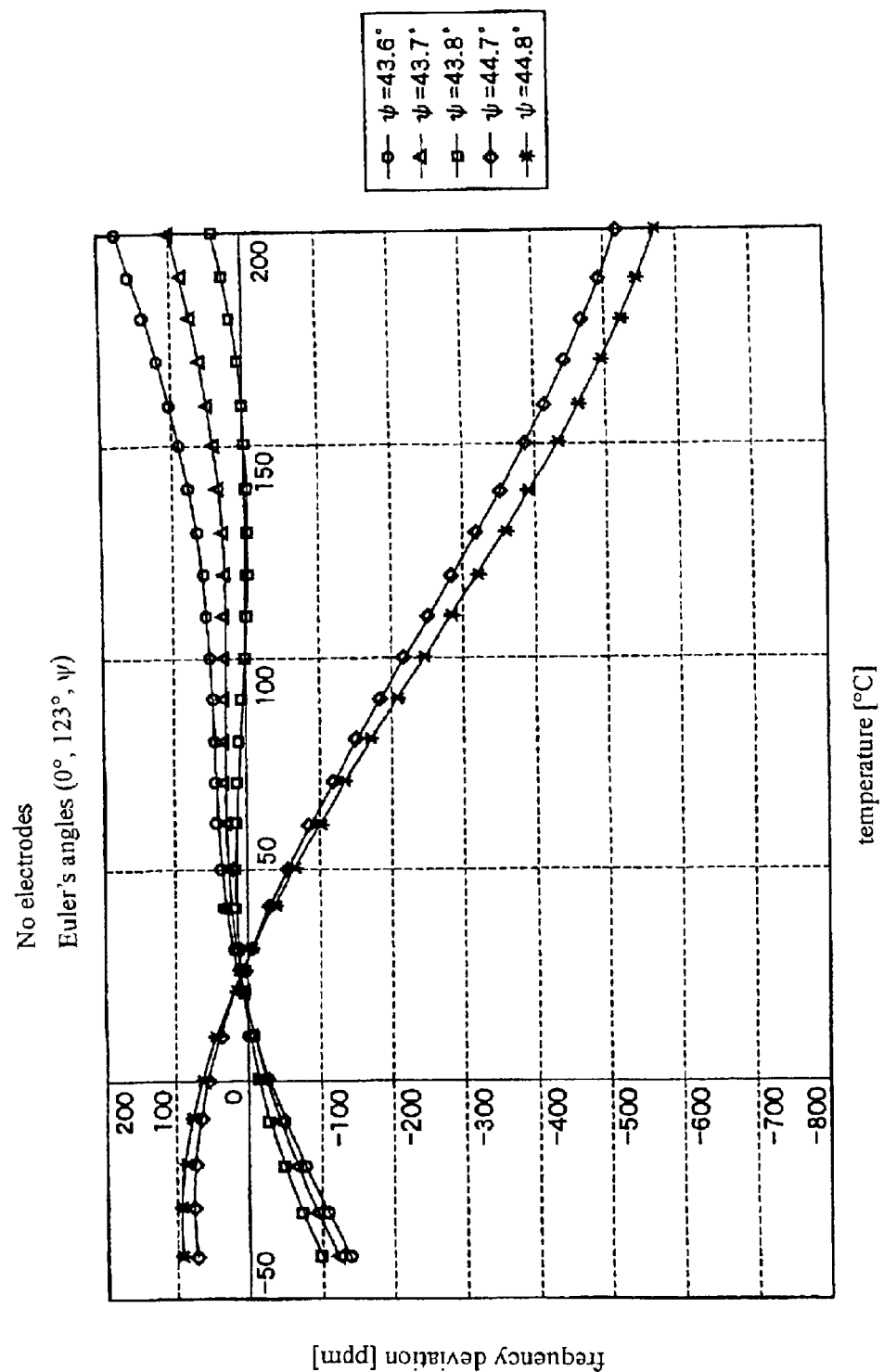
FIG. 10 is a graph verifying that the cubic function has/does not have an extreme value in a transversal type SAW filter using an in-plane rotated ST cut quartz crystal plate having the Euler angles of (0°, 113–135°, ±(40–49°))
Figure 11:
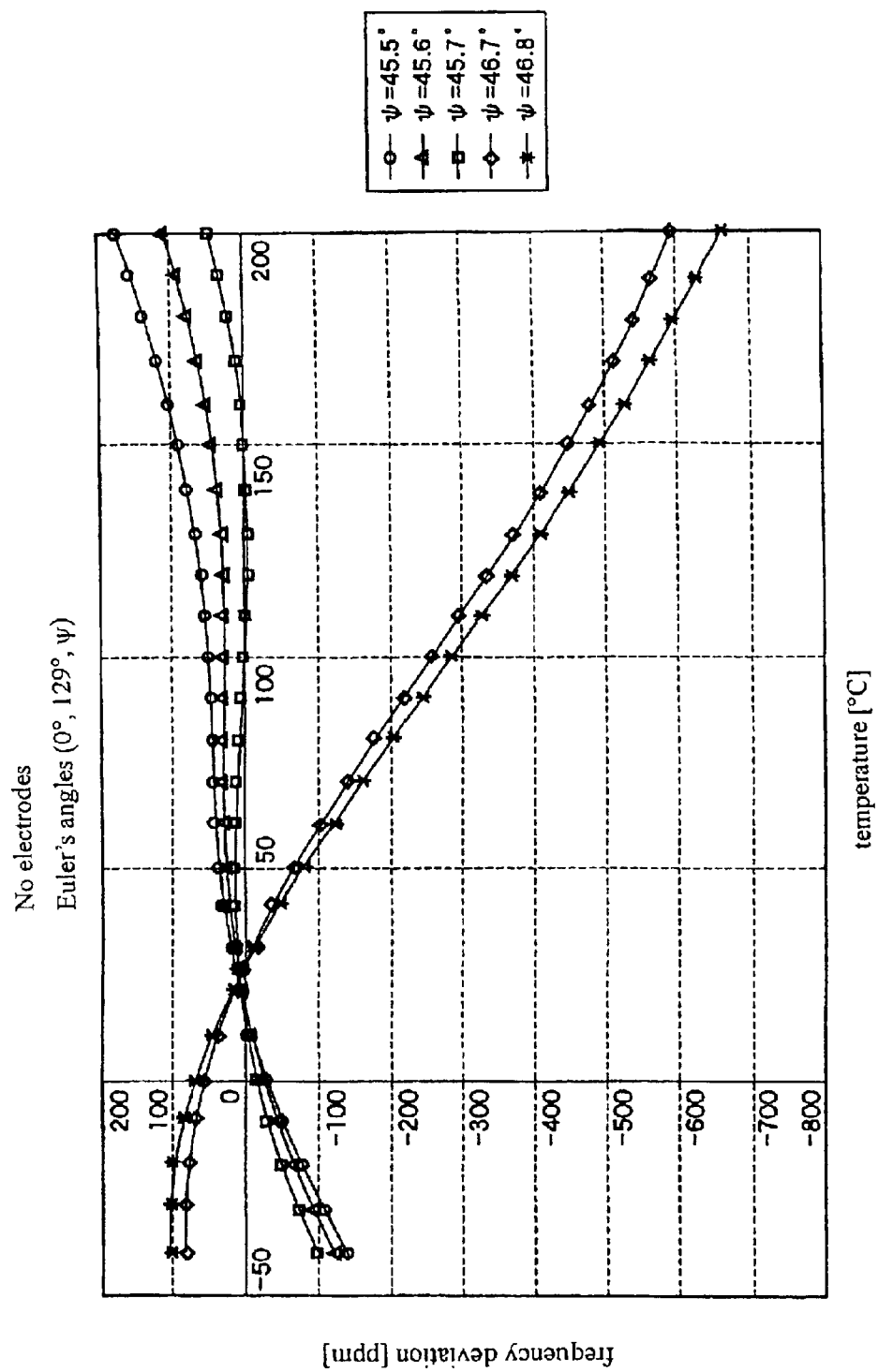
FIG. 11 is a graph verifying that the cubic function has/does not have an extreme value in a transversal type SAW filter using an in-plane rotated ST cut quartz crystal plate having the Euler angles of (0°, 113–135°, ±(40–49°))
Figure 12:
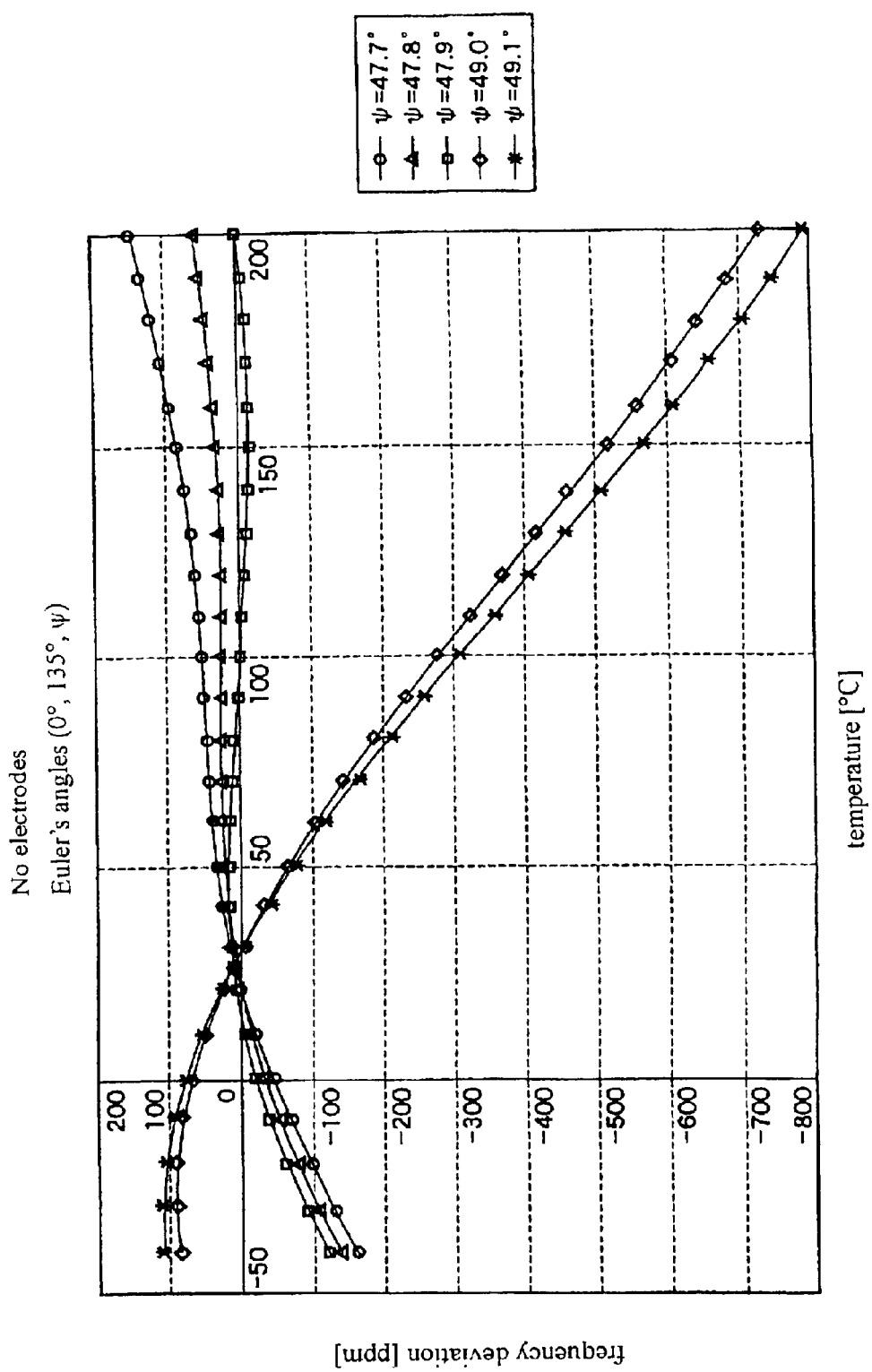
FIG. 12 is a graph verifying that the cubic function has/does not have an extreme value in a transversal type SAW filter using an in-plane rotated ST cut quartz crystal plate having the Euler angles of (0°, 113–135°, ±(40–49°))

FIGS. 4 and 10 show that a similar temperature-dependent property curve is obtained using the same θ, but different ψ for the Euler angles (0°, θ, ψ) depending on the presence and absence of the electrodes. For instance, the limit value of ψ to give an extreme value is 43.7° in FIG. 10 and 42.7° in FIG. 4, which is smaller by 1 degree. In other words, the presence of electrodes makes it difficult to find the temperature-dependent property having an extreme value (local maximum or local minimum) within the temperature range of −40 to +85° C. by simply using the ψ's range defined by the hatching 5 in FIG. 3. Therefore, the range that is extended by 1 degree to smaller value from that defined by the hatching 5 in FIG. 3 (which is the hatching 4) is added to the hatching 5 to facilitate the finding of the temperature-dependent property having an extreme value (local maximum or local minimum) within the temperature range of −40 to +85° C. irrespective of the presence or absence of the electrodes. The combined range of the hatchings 4 and 5 is defined by the expression 1.

FIGS. 5 to 7 and 8 show the temperature-dependent property of a resonator type SAW device having the Euler angles of (0°, 117°, ψ), (0°, 129°, ψ), and (0°, 135°, ψ). FIGS. 5–7 and 8 show that it is not easy to find the temperature-dependent property having an extreme value (local maximum or local minimum) within the temperature range of −40 to +85° C. by using only the ψ's range defined by the hatching 5 in FIG. 3. However, the temperature-dependent property having an extreme value (local maximum or local minimum) within the temperature range of −40 to +85° C. is easily found by using the combined region of the hatchings 4 and 5.

Recognizing the cut angle within the Euler angles range above which achieves the temperature-dependent property having an extreme value within the temperature range of −40 to +85° C. allows for minimizing the frequency fluctuation within the operational temperature range of a surface acoustic wave device. As is shown in FIG. 13 (1), a resonator type SAW device complying with the hatching 4 in FIG. 3 has the peak temperature nearly at the center (25° C.) of the operational temperature range of −40 to +85° C. However, the temperature-dependent property of frequency is expressed by a cubic function in FIG. 13(1) and, therefore, the frequency fluctuation is not symmetrical about the peak temperature as a reference. To reduce the fluctuation of the temperature-dependent property expressed by a cubic function, the peak temperature should be shifted to the lower temperatures so that the frequency fluctuation is same as a reference on the higher and lower temperature sides.

Figure 14:
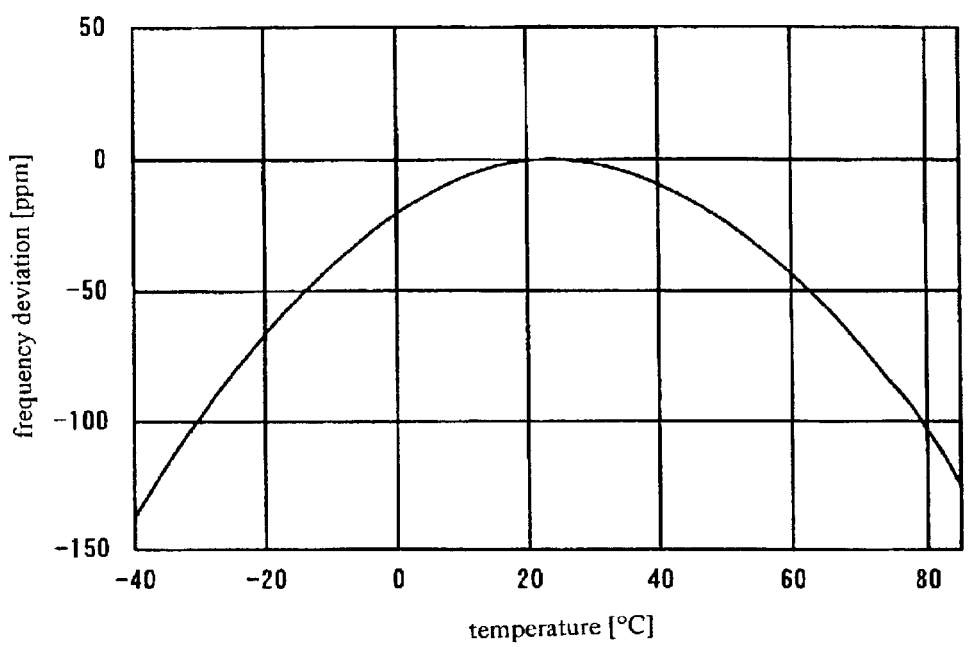
FIG. 14 is a graph showing the temperature-dependent property of a prior art ST cut resonator type SAW device having the Euler angles of (0°, 123°, 0°)

FIG. 13 (1) is a graph showing the temperature-dependent property of a resonator type SAW device having an in-plane rotated ST cut quartz crystal plate and having the Euler angles of (0°, 123°, 43°). Here, the frequency fluctuation can be reduced to 71 ppm compared to a related art ST cut having the Euler angles of (0°, 123°, 0°) shown in FIG. 14. However, this resonator type SAW device has the peak temperature at 25° C., which is nearly the center of the operational temperature range. The frequency fluctuation can be reduced within the operational temperature range by modifying the peak temperature. To do so, the peak temperature is shifted to the lower temperatures.

An in-plane rotated ST cut quartz crystal plate has the temperature-dependent property expressed by a cubic function. Rotating the temperature-dependent property curve about the inflection point gives similar results to the peak temperature shift. First, the thickness H of the IDT electrode deposit can be modified to shift the peak temperature shown in FIG. 13 (1) to the lower temperatures. The electrode deposit thickness H is increased so that the deposit thickness ratio H/λ is increased as is shown in FIG. 13 (2). This causes the peak temperature to shift to the lower temperatures thereby adjusting the temperature-dependent property. The rotation in the plane about the Z' axis can be also adjusted to modify the temperature-dependent property around the inflection point. This is realized by modifying the angle that determines the direction along which the electrodes are formed (the surface acoustic wave propagation direction). As is shown in FIG. 13 (3), the rotation angle ψ in the plane about the Z' axis can be changed to ψ=43.1° from ψ=43.0°. Furthermore, an adjustment is performed by changing η (electrode width/electrode pitch) of the IDT electrode. This is shown in FIG. 13 (4). Those modifications allow a further reduced frequency fluctuation within the operational temperature range compared to the related art temperature-dependent property.

The surface acoustic wave device has smaller electrodes for higher resonation frequencies. The smaller electrodes have smaller widths, which increases manufacturing error of the electrode width. This leads to a larger deviation in η (electrode width/electrode pitch) that further affects the temperature-dependent property. For instance, η has the manufacturing error of approximately ±0.1 for 1 GHz. This hampers the steady manufacturing of the surface acoustic wave device using an in-plane rotated ST cut quartz crystal plate 1 with a frequency fluctuation of less than 100 ppm within the temperature range of −40 to +85° C. when a resonance frequency as high as 1 GHz is required.

Figure 15:
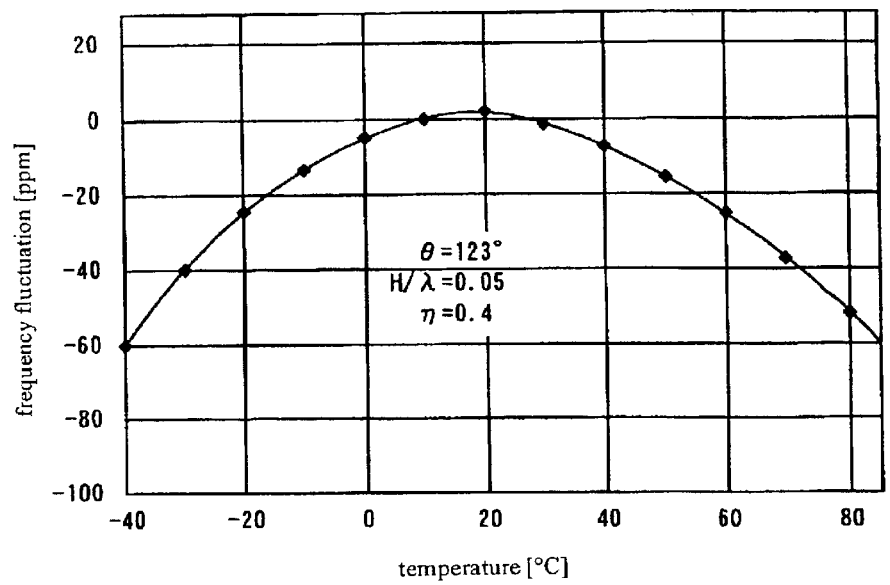
FIG. 15 is a graph showing the temperature-dependent property of an in-plane rotated ST cut resonator type SAW device having θ=123°, H/λ=0.05, η=0.4 according to an embodiment.

For instance, with a resonator type SAW device using an in-plane rotated ST cut quartz crystal plate 1 having the Euler angles of (φ, θ, ψ), where φ=0° and θ=123° and the deposit thickness ratio H/λ=0.05, η=0.4, the frequency fluctuation within the operational temperature range of −40 to +85° C. can be adjusted to approximately 60 ppm as is shown in FIG. 15. Here, in the case in FIG. 15, ψ is adjusted within the angle range provided by the expression 1 to obtain the optimized temperature-dependent property based on the frequency measured at 25° C.

Figure 16:
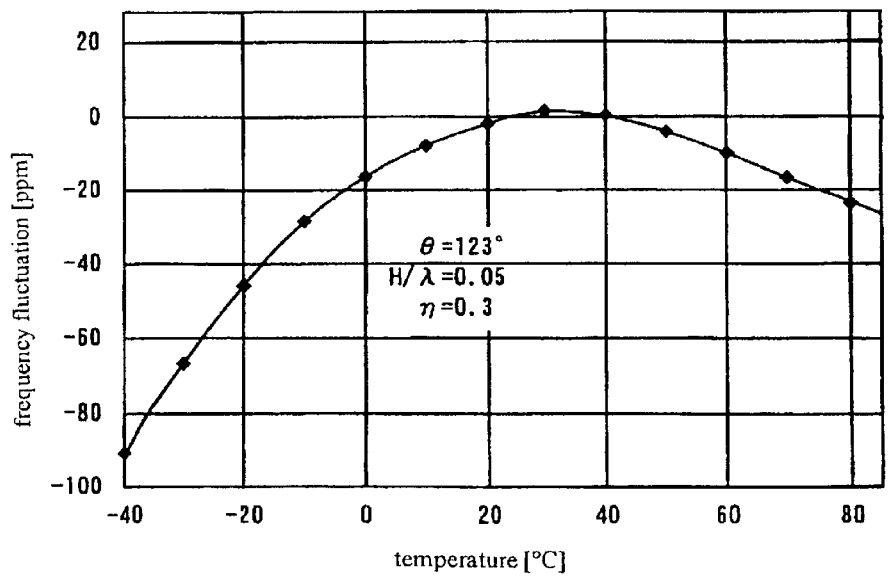
FIG. 16 is a graph showing the temperature-dependent property of an in-plane rotated ST cut resonator type SAW device having θ=123°, H/λ=0.05, η=0.3 according to an embodiment.
Figure 17:
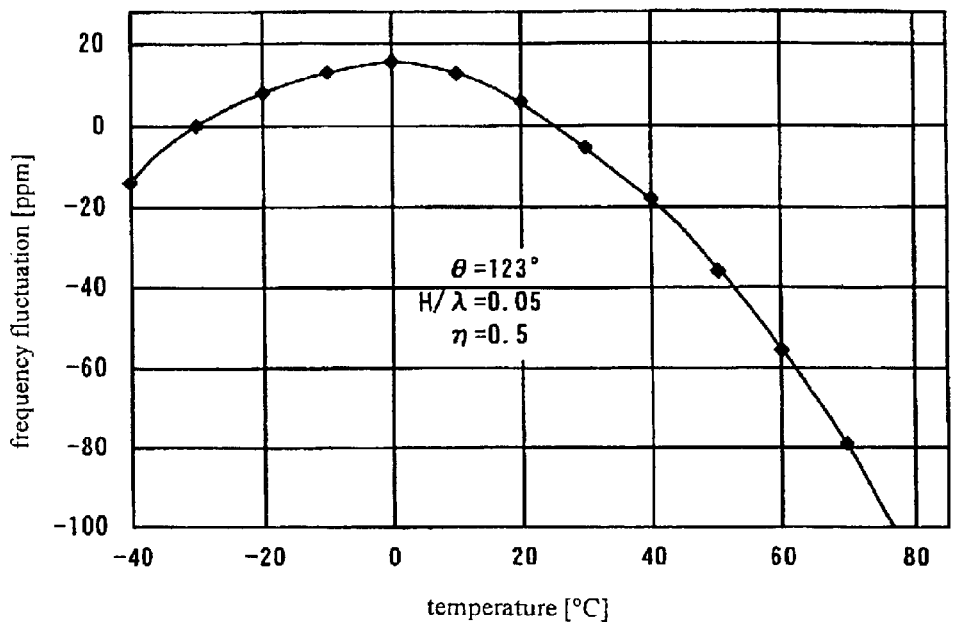
FIG. 17 is a graph showing the temperature-dependent property of an in-plane rotated ST cut resonator type SAW device having θ=123°, H/λ=0.05, η=0.5 according to an embodiment.

Using the same Euler angles and deposit thickness ratio, but a smaller electrode width η=0.3, the frequency fluctuation exceeds 90 ppm as is shown in FIG. 16. On the other hand, using the same Euler angles and deposit thickness ratio, but a larger electrode width η=0.5, the frequency fluctuation is 134 ppm as is shown in FIG. 17 (the frequency fluctuation at 85° C. is not shown in FIG. 17). Therefore, when η=0.4 is targeted for the frequency fluctuation less than 100 ppm, the manufacturing error of the electrode width causes the resonator type SAW device to have the frequency fluctuation larger than 100 ppm.

Studies by the present inventors found the cut angle of a quartz crystal plate that achieves an in-plane rotated ST cut resonator type SAW device having the frequency fluctuation less than 100 ppm within the temperature range −40 to +85° C. regardless of the manufacturing error of the electrode width. FIGS. 18 to 23 show the relationship between θ of the Euler angles and the deposit thickness ratio (H/λ) and η. The axis of ordinate shows the maximum frequency fluctuation when η changes by ±0.1. For instance, the maximum frequency fluctuation is translated from FIG. 17 that shows the largest maximum frequency fluctuation among FIGS. 15 to 17 that show the frequency fluctuation, where θ=123°, H/λ=0.05, and η=0.4±0.1, respectively. ψ is the angle range provided by the expression 1, which is not shown. In all the cases, frequency fluctuation in the temperature range of −40 to +85° C. based on the frequency measured at 25° C. as a reference is shown.

Figure 18:
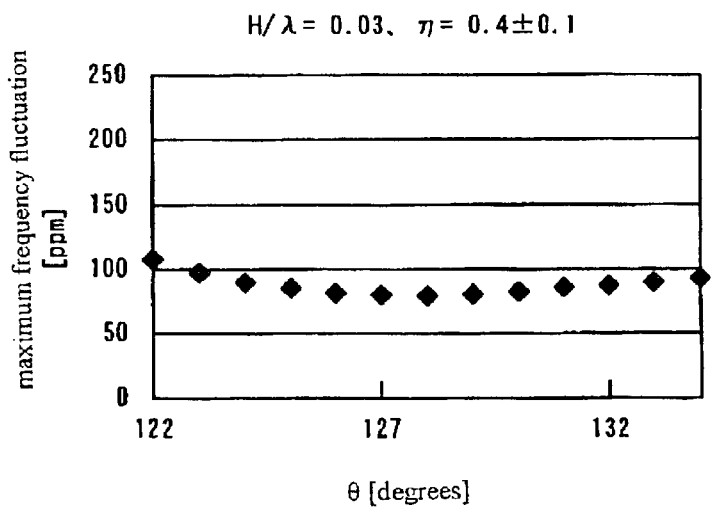
FIG. 18 is a graph showing the relationship between θ and the maximum frequency fluctuation within the temperature range of −40 to +85° C. of an in-plane rotated ST cut resonator type SAW device having H/λ=0.03, η=0.4±0.1 according to an embodiment.
Figure 19:
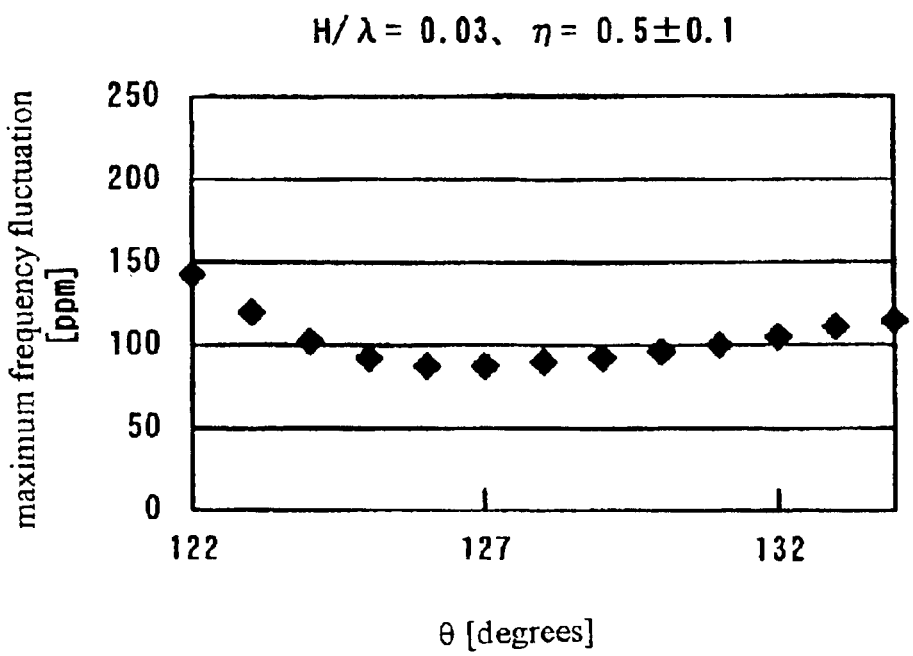
FIG. 19 is a graph showing the relationship between θ and the maximum frequency fluctuation within the temperature range of −40 to +85° C. of an in-plane rotated ST cut resonator type SAW device having H/λ=0.03, η=0.5±0.1 according to an embodiment.

FIG. 18 shows the case wherein H/λ=0.03 and η=0.4±0.1. Here, the frequency fluctuation is lowered to less than 100 ppm with θ=123–134°. FIG. 19 shows the case wherein H/λ=0.03, η=0.5±0.1. The frequency fluctuation is lowered to less than 100 ppm with θ=125–131°.

Figure 20:
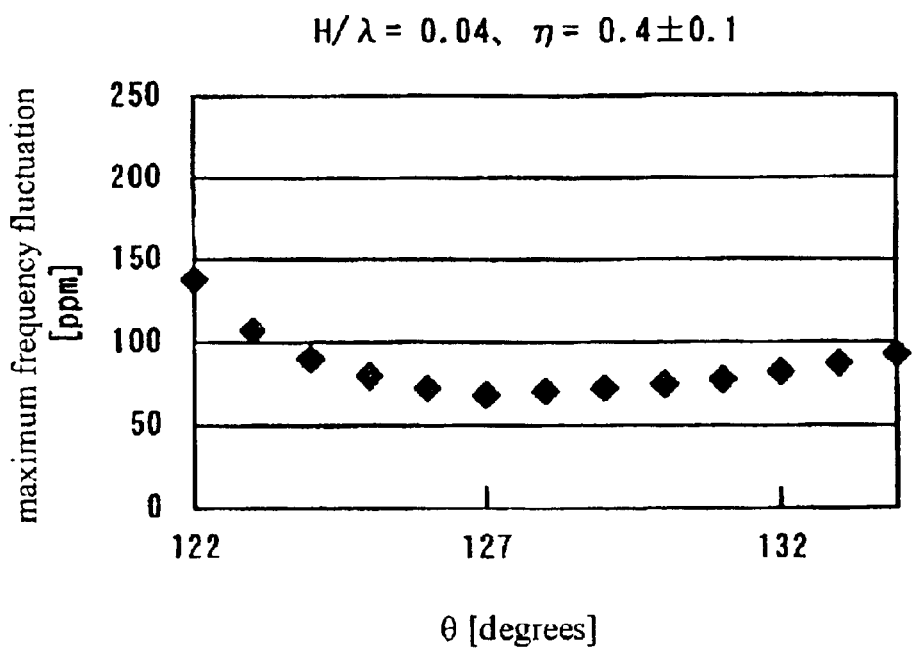
FIG. 20 is a graph showing the relationship between θ and the maximum frequency fluctuation within the temperature range of −40 to +85° C. of an in-plane rotated ST cut resonator type SAW device having H/λ=0.04, η=0.4±0.1 according to an embodiment.
Figure 21:
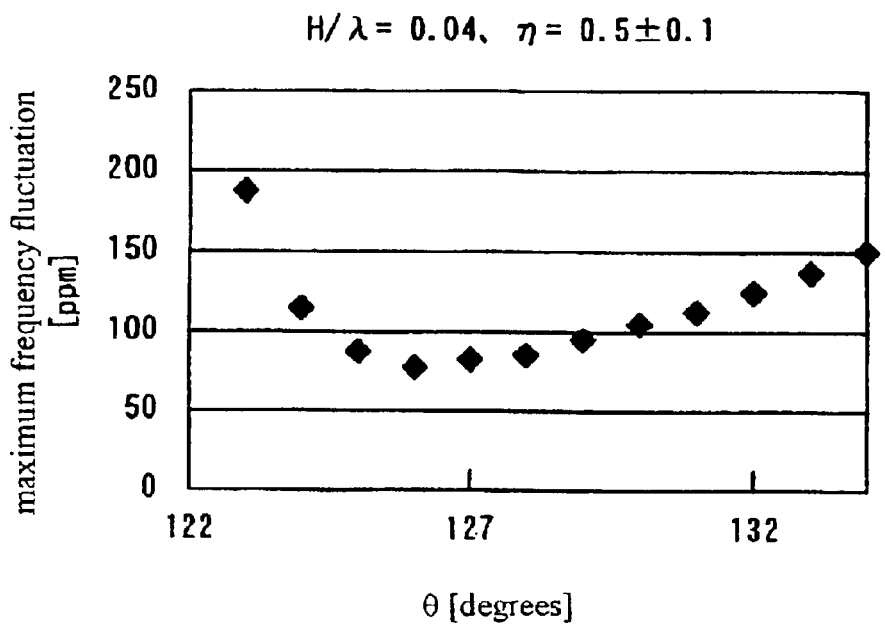
FIG. 21 is a graph showing the relationship between θ and the maximum frequency fluctuation within the temperature range of −40 to +85° C. of an in-plane rotated ST cut resonator type SAW device having H/λ=0.04, η=0.5±0.1 according to an embodiment.
Figure 22:
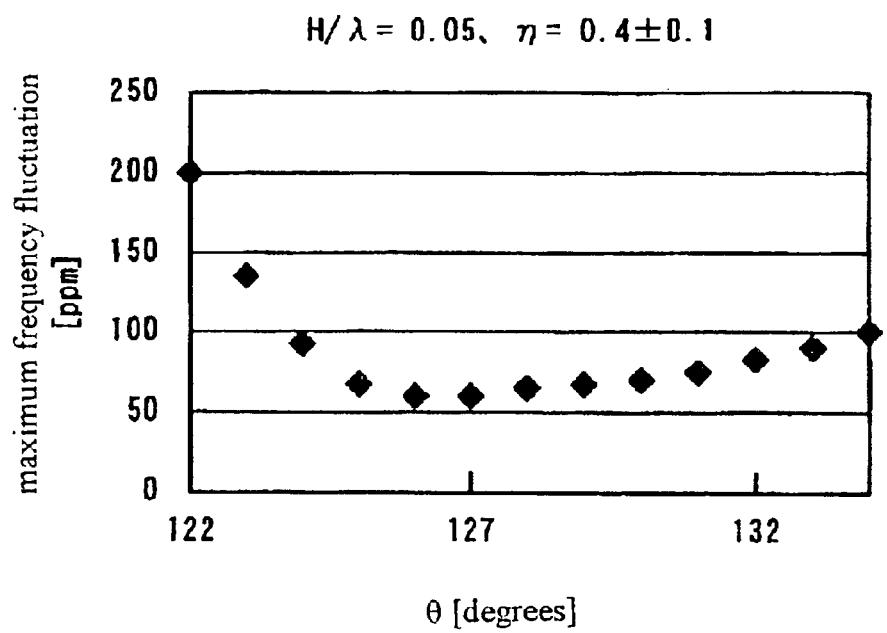
FIG. 22 is a graph showing the relationship between θ and the maximum frequency fluctuation within the temperature range of −40 to +85° C. of an in-plane rotated ST cut resonator type SAW device having H/λ=0.05, η=0.4±0.1 according to an embodiment.
Figure 23:
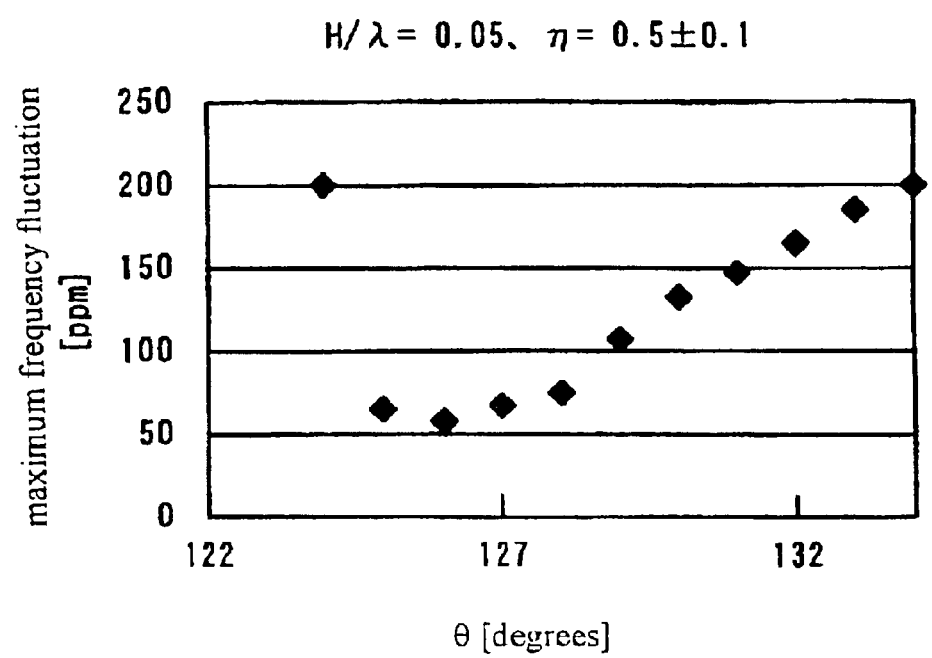
FIG. 23 is a graph showing the relationship between θ and the maximum frequency fluctuation within the temperature range of −40 to +85° C. of an in-plane rotated ST cut resonator type SAW device having H/λ=0.05, η=0.5±0.1 according to an embodiment.

FIG. 20 shows the case where H/λ=0.04 and η=0.4±0.1. Here, the frequency fluctuation is lowered to less than 100 ppm with θ=124–134°. FIG. 21 shows the case where H/λ=0.04 and η=0.5±0.1; the frequency fluctuation is lowered to less than 100 ppm with θ=125–129°. FIG. 22 shows the case where H/λ=0.05 and η=0.4±0.1; the frequency fluctuation is lowered to less than 100 ppm with θ=124–134°. FIG. 23 shows the case where H/λ=0.05 and η=0.5±0.1; the frequency fluctuation is lowered to less than 100 ppm with θ=125–128°.

Consequently, the frequency fluctuation is lowered to less than 100 ppm within the temperature range of −40 to +85° C. using θ=125–128° when manufacturing error of less than 0.2 within η=0.3–0.6.

This range is also obviously effective for the frequency bands for which the electrode width manufacturing error is relatively small (such as 300 MHz, 600 MHz).

As is described above, the present invention provides a method for adjusting the temperature-dependent property of a surface acoustic wave device using an in-plane rotated ST cut quartz crystal plate having the Euler angles of (0°, 113–135°, ±(40–49°)), where the range of Euler angles is determined so that the temperature-dependent property of the surface acoustic wave device using an in-plane rotated ST cut quartz crystal plate, having the temperature-dependent property expressed by a cubic function, has an extreme value. Further, the temperature-dependent property is rotated about the inflection point to minimize frequency fluctuation within the operational temperature range. Therefore, the oscillation frequency fluctuation can be minimized regardless of the ambient temperature changes.

What is claimed is:

1. A method for adjusting the temperature-dependent property of a surface acoustc wave device using an in-plane rotated ST cut quartz crystal plate having Euler angles of (0°, 113–135°, ±(40–49°)), comprising:

expressing the temperature-dependent property of the surface acoustic wave device, using the in-plane rotated ST cut quartz crystal plate having the temperature-dependent property, by a cubic function; and adjusting the expressed temperature-dependent property by rotating the temperature-dependent property about an inflection point.

2. The method for adjusting the temperature-dependent property of a surface acoustic wave device according to claim 1, further including:

determining a range of Euler angles so that the temperature-dependent property of the surface acoustic wave device using the in-plane rotated ST cut quartz crystal plate having the temperature-dependent property expressed by the cubic function has an extreme value; and subsequently rotating the temperature-dependent property about the inflection point to minimize fluctuation of the temperature-dependent property in the operational temperature range.

3. The method for adjusting the temperature-dependent property of a surface acoustic wave device according to claim 1, further including providing Euler angles that are (0°, θ, ψ), ψ is in the following range:

$$\psi = 0.3295\theta + 3.3318° \pm 1.125°.$$

4. The method for adjusting the temperature-dependent property of a surface acoustic wave device according to claim 1, further including providing Euler angles that are (0°, θ, ψ), θ=125–128°, and η (electrode width/electrode pitch) that is 0.3–0.6.

5. The method for adjusting the temperature-dependent property of a surface acoustic wave device according to claim 1, further including modifying the temperature-dependent property around the inflection point by adjusting the thickness of the electrode deposits of the surface acoustic wave device.

6. The method for adjusting the temperature-dependent property of a surface acoustic wave device according to claim 1, further including modifying the temperature-dependent property around the inflection point by rotating the quartz crystal in a plane about the Z' axis.

7. The method for adjusting the temperature-dependent property of a surface acoustic wave device according to claim 1, further including modifying the temperature-dependent property around the inflection point by changing η (electrode width/electrode pitch) of electrodes of the surface acoustic wave device.

8. A surface acoustic wave device manufactured by the method for adjusting the temperature-dependent property of a surface acoustic wave device according to claim 1.

* * * * *